(12) United States Patent
Wong et al.

(10) Patent No.: US 9,314,817 B2
(45) Date of Patent: Apr. 19, 2016

(54) THREE-DIMENSIONAL VERTICALLY ALIGNED FUNCTIONALIZED MULTILAYER GRAPHENE

(71) Applicants: Ching P. Wong, Atlanta, GA (US); Qizhen Liang, Atlanta, GA (US)

(72) Inventors: Ching P. Wong, Atlanta, GA (US); Qizhen Liang, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 422 days.

(21) Appl. No.: 13/783,505

(22) Filed: Mar. 4, 2013

(65) Prior Publication Data

US 2014/0248430 A1 Sep. 4, 2014
US 2016/0038971 A9 Feb. 11, 2016

Related U.S. Application Data

(60) Provisional application No. 61/604,874, filed on Feb. 29, 2012.

(51) Int. Cl.
| | |
|---|---|
| *B05D 3/12* | (2006.01) |
| *H01B 1/04* | (2006.01) |
| *H01L 23/373* | (2006.01) |
| *H01L 23/42* | (2006.01) |
| *C01B 31/04* | (2006.01) |

(52) U.S. Cl.
CPC ............. *B05D 3/12* (2013.01); *C01B 31/0484* (2013.01); *H01B 1/04* (2013.01); *H01L 23/373* (2013.01); *H01L 23/42* (2013.01); *H01L 23/3735* (2013.01); *H01L 23/3736* (2013.01); *H01L 2924/0002* (2013.01)

(58) Field of Classification Search
CPC .... B82Y 30/00; B82Y 40/00; C01B 31/0484; C01B 31/0438; H01B 1/04

USPC .................................................. 427/289, 292
See application file for complete search history.

(56) References Cited

U.S. PATENT DOCUMENTS

| | | |
|---|---|---|
| 6,924,335 B2 | 8/2005 | Fan et al. |
| 7,504,453 B2 | 3/2009 | Hu et al. |
| 7,678,614 B2 | 3/2010 | Huang et al. |

(Continued)

OTHER PUBLICATIONS

Liang et al. A Three-Dimensional Vertically Aligned Functionalized Multilayer Graphene Architecture: An Approach for Graphene-Based Thermal Interfacial Materials, ACS Nano, vol. 5, No. 3, 2011, pp. 2392-2401.*

(Continued)

*Primary Examiner* — Kelly M Gambetta
(74) *Attorney, Agent, or Firm* — Bryan W. Bockhop; Bockhop & Associates, LLC

(57) ABSTRACT

In a method of making a thermal interface material, functionalized graphene sheets are dispersed in a liquid. The liquid is removed through a filter so as to form a filtration cake of aligned functionalized graphene sheets, substantially all of which are parallel to a common plane. At least one block of aligned functionalized graphene sheets is cut from the filtration cake. The block includes a first end face and an oppositely-disposed second end face that are parallel to each other and to which substantially all of the functionalized graphene sheets are transverse. The block also includes two oppositely-disposed sides to which substantially all of the functionalized graphene sheets are parallel. A first layer of a thermally conductive substance is applied to the first end face and a second layer of the thermally conductive substance is applied to the second end face of the block.

19 Claims, 2 Drawing Sheets

(56) References Cited

U.S. PATENT DOCUMENTS

| | | |
|---|---|---|
| 8,129,001 B2 | 3/2012 | Wang et al. |
| 2005/0161210 A1 | 7/2005 | Zhong et al. |
| 2005/0255304 A1 | 11/2005 | Brink |
| 2010/0128439 A1 | 5/2010 | Tilak et al. |
| 2010/0196659 A1 | 8/2010 | Razeeb et al. |

OTHER PUBLICATIONS

Shahil et al. Graphene—Multilayer Graphene Nanocomposites as Highly Efficient Thermal Interface Materials, NanoLett, Jan. 12, 2012, pp. 861-867.*

* cited by examiner

THREE-DIMENSIONAL VERTICALLY ALIGNED FUNCTIONALIZED MULTILAYER GRAPHENE

CROSS-REFERENCE TO RELATED APPLICATION(S)

This application claims the benefit of U.S. Provisional Patent Application Ser. No. 61/604,874, filed Feb. 29, 2012, the entirety of which is hereby incorporated herein by reference.

STATEMENT OF GOVERNMENT INTEREST

This invention was made with government support under agreement No. CMMI-0800849, awarded by the National Science Foundation. The government has certain rights in the invention.

BACKGROUND OF THE INVENTION

1. Field of the Invention

The present invention relates to thermal interface materials and, more specifically to thermal interface materials using graphene.

2. Description of the Related Art

Thermal interfacial materials (TIMs) are thermally conductive materials that are used to increase thermal contact conductance across surfaces. For example, TIMs are used to couple microprocessors and heat sinks to increase the thermal transfer efficiency from the microprocessors to the heat sinks TIMs replace air gaps between the objects being coupled. As air is a thermal insulator, unfilled air gaps can greatly reduce the rate of heat transfer from a microprocessor. Common TIMs include thermal grease made from silicone oil filled with aluminum oxide, zinc oxide, or boron nitride. Such thermal greases tend to be messy and have limited heat transfer rates.

Therefore, there is a need for a highly thermally efficient thermal interface material.

SUMMARY OF THE INVENTION

The disadvantages of the prior art are overcome by the present invention which, in one aspect, is a method of making a thermal interface material, in which functionalized graphene sheets are dispersed in a liquid. The liquid is removed through a filter so as to form a filtration cake of aligned functionalized graphene sheets, substantially all of which are parallel to a common plane. At least one block of aligned functionalized graphene sheets is cut from the filtration cake. The block includes a first end face and an oppositely-disposed second end face that are parallel to each other and to which substantially all of the functionalized graphene sheets are transverse. The block also includes two oppositely-disposed sides to which substantially all of the functionalized graphene sheets are parallel. A first layer of a thermally conductive substance is applied to the first end face and a second layer of the thermally conductive substance is applied to the second end face of the block.

In another aspect, the invention is a method of making a thermal interface material for thermally coupling a heat source to a heat sink, functionalized graphene sheets are dispersed in a liquid. The liquid is removed through a filter so as to form a filtration cake of aligned functionalized graphene sheets, substantially all of which are parallel to a common plane. At least one block of aligned functionalized graphene sheets is cut from the filtration cake. The block includes a first end face and an oppositely-disposed second end face that are parallel to each other and to which substantially all of the functionalized graphene sheets are transverse. The block also includes two oppositely-disposed sides to which substantially all of the functionalized graphene sheets are parallel. A first stabilizing layer is applied to the first end face and a second stabilizing layer is applied to the second end face. The first stabilizing layer is placed to be in thermal communication with the heat source and the second stabilizing layer is placed to be in thermal communication with the heat sink.

In yet another aspect, the invention is a thermal interface material, that includes a block of a plurality of functionalized graphene sheets that are substantially all aligned so as to be parallel to a common plane. The block has a first end face that is transverse to the common plane and a second end face that is transverse to the common plane.

A first layer of a thermally conductive substance is applied to the first end face and a second layer of the thermally conductive substance is applied to the second end face. A first silicon layer is applied to the first layer of the thermally conductive substance and a second silicon layer is applied to the second layer of the thermally conductive substance.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
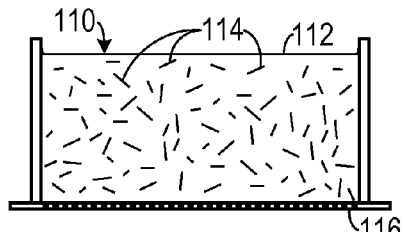
FIGS. 1A-1K is a series of schematic diagrams showing one method of making a thermal interfacial material.
Figure 1B:
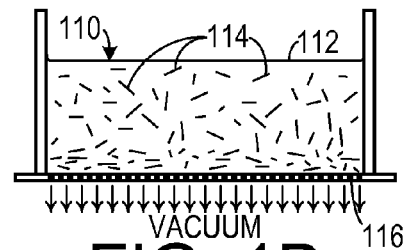
Figure 1C:
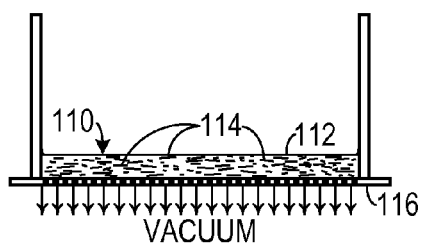
Figure 1D:
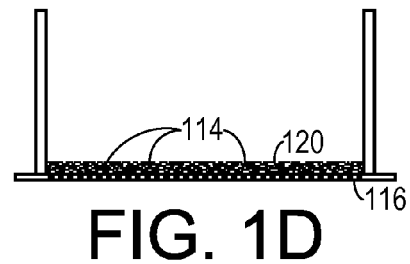
Figure 1E:
Figure 1F:
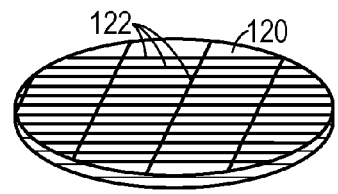
Figure 1G:
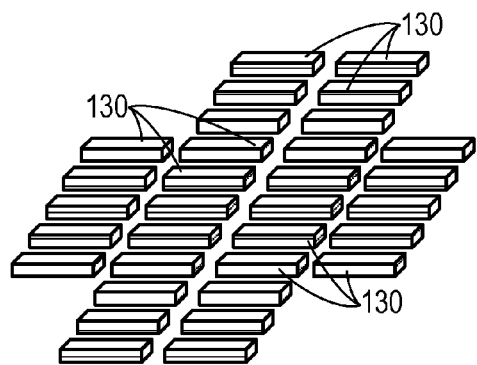
Figure 1H:
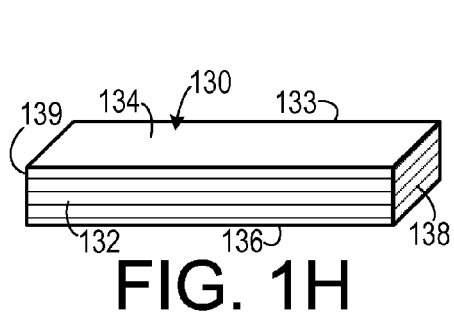
Figure 1I:
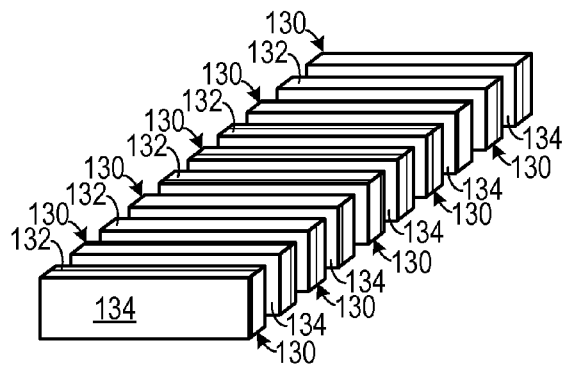
Figure 1J:
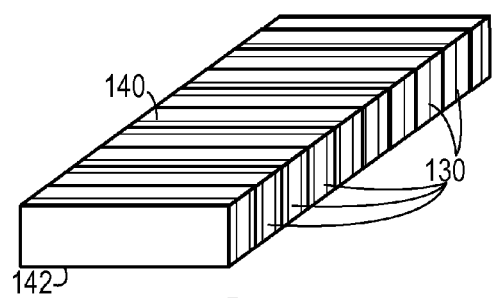
Figure 1K:
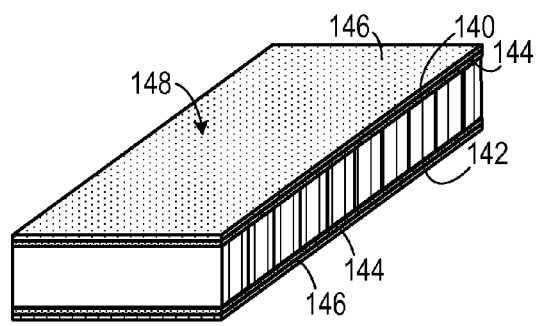

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIGS. 1A-1K, one method of making a vertically aligned functionalized multilayer graphene block 130 begins with making a dispersion 110 by dispersing a plurality of graphene sheets 114 in a liquid 112 such as water. The liquid 112 is removed from the dispersion through a filter 116, such as by applying a vacuum to the filter 116. In one embodiment, the filter 116 includes an aluminum oxide filtration paper. As the liquid 112 is removed, the graphene sheets 114 will lay down in an orientation in which they are substantially aligned so as to be parallel to a common plane. Eventually, substantially all of the liquid 112 is removed, leaving a cake 120 of graphene sheets 114 that are aligned with each other.

The cake 120 may then be cut along predetermined lines 122, thereby generating a plurality of blocks 130 of aligned graphene.

Each block includes a first end face 132, a second end face 133 that is opposite from the first end face 132, a third end face 138, an opposite fourth end face 139, a top side 134 and an opposite bottom side 136. Substantially all of the graphene sheets 114 are aligned parallel to the top side 134 and are transverse to the first end face 132.

A plurality of the blocks 130 are rotated so that the first end face 132 is facing upwardly. The blocks 130 are then drawn together so as to form a common top surface 140 and an opposite bottom surface 142. A layer of a thermally conductive substance 144, such as indium, is applied to both the top surface 140 and the bottom surface 142 and then a layer of silicon 146 is applied to each layer of the thermally conductive substance 144, resulting in the formation of a thermal interface material unit 148.

Figure 2:
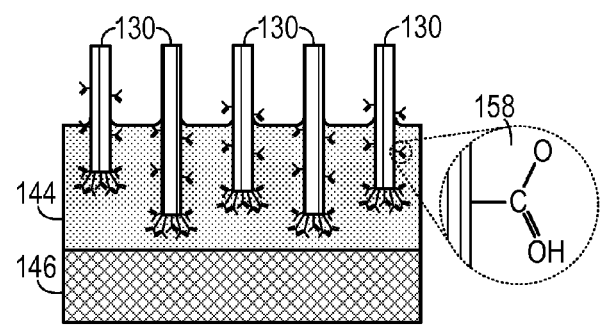
FIG. 2 is a schematic diagram showing an interface between functionalized graphene sheets and indium.

As shown in FIG. 2, the thermally conductive substance 144 adheres to the graphene sheet blocks 130 and the silicon layer adheres to the thermally conductive substance 144. The graphene sheets may also be functionalized with functionalizing molecules 158 so as to overcome forces that might interfere with their alignment. Graphene may be functionalized, for example, with functional groups such as conjugated carbon-carbon, carbon-hydroxyls, and carboxyls.

Figure 3:
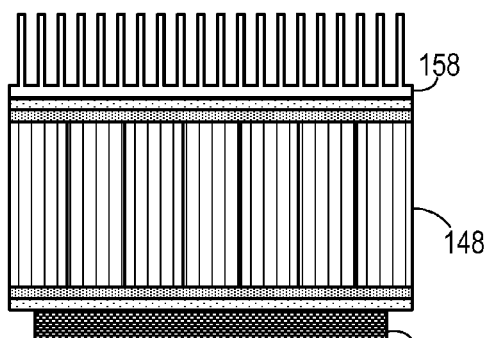
FIG. 3 is a schematic diagram showing a thermal interfacial material coupled to a heat source and a heat sink.

In one embodiment, as shown in FIG. 3, the thermal interface material unit 148 can be thermally coupled to a heat source 156 (such as an integrated circuit) and a heat sink 158. Because of the superior conductivity of graphene along its planar axis, heat transfer from the heat source 156 to the heat sink 158 through the thermal interface material unit 148 is highly efficient.

In one experimental embodiment, functionalized multilayer graphene (fMG) was synthesized and 0.8 g of the fMG sheets were dispersed in 1 L of deionized water. The dispersal was vacuum-filtrated with a 47 mm vacuum filtration system equipped with an anodic aluminum oxide (AAO) filtration paper (0.1 μm pore size, Anodisc 47, Whatman International Ltd.). The obtained filtration cake was washed by in dionized water, removed from filtration paper, and dried at 105° C. for 3 hours. In order to obtain a high thermally conductive array, reduction-free thermally conductive surface functionalized multilayer graphene sheets (functionalized multilayer graphene) were aligned. Functionalized multilayer graphene sheets were prepared in a moderate oxidation environment (mixed sulfuric and nitric acid) with aid of sonication. The thickness of the functionalized multilayer graphene sheets was in the range of between 2 nm and 10 nm, with an average thickness of 7.35 nm.

Graphene is susceptible to van der Waals forces and tends to be recumbent on substrates. If aligned and densely packed in an array, multilayer graphene sheets can be self-supporting, conveniently rearranged, and vertically assembled between solid surfaces thereafter. In order to obtain a high thermally conductive array, reduction-free thermally conductive surface functionalized multilayer graphene sheets (functionalized multilayer graphene) were aligned. The thickness of the functionalized multilayer graphene sheets was in the range of between 2 nm and 10 nm, with an average thickness of 7.35 nm.

Silicon wafers (1 mm by 1 mm) were coated with melted pure indium at a temperature of 180° C. The thickness of the indium coating was about 10 μm after careful polishing at room temperature. A-functionalized multilayer graphene samples were sliced and sandwiched between thus-prepared Silicon wafers with an orientation of functionalized multilayer graphene perpendicular to the contacted Silicone surfaces, corresponding to vertically aligned-functionalized multilayer graphene thermal interface material assemblies. The sandwiched samples were clamped with small pressure (about 0.02 MPa) and placed in a convection oven at 200° C. for 20 minutes and then cooled to room temperature.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of making a thermal interface material, comprising the steps of:
    (a) dispersing functionalized graphene sheets in a liquid;
    (b) removing the liquid through a filter so as to form a filtration cake of aligned functionalized graphene sheets, substantially all of which are parallel to a common plane;
    (c) cutting at least one block of aligned functionalized graphene sheets from the filtration cake, the block including a first end face and an oppositely-disposed second end face that are parallel to each other and to which substantially all of the functionalized graphene sheets are transverse, the block also including two oppositely-disposed sides to which substantially all of the functionalized graphene sheets are parallel; and
    (d) applying a first layer of a thermally conductive substance to the first end face and applying a second layer of the thermally conductive substance to the second end face of the block.

2. The method of claim 1, wherein the step of removing the liquid comprises the step of applying a filtration process to the liquid.

3. The method of claim 2, wherein the step of applying a filtration process comprises the steps of:
    (a) disposing the functionalized graphene sheets dispersed in the liquid on a first side filtration paper; and
    (b) applying a vacuum to a second side of the filtration paper, wherein the second side is opposite from the first side, so as to draw the liquid through the filtration paper and away from the functionalized graphene sheets.

4. The method of claim 3, wherein the filtration paper comprises an aluminum oxide filtration paper.

5. The method of claim 1, wherein the liquid comprises water.

6. The method of claim 1, wherein the functionalized graphene sheets comprise functionalized multilayer graphene sheets.

7. The method of claim 1, wherein the functionalized graphene sheets comprise graphene functionalized with functional groups of a material selected from a group of materials consisting of: conjugated carbon-carbon, carbon-hydroxyls, carboxyls, and combinations thereof.

8. The method of claim 1, wherein the thermally conductive substance comprises indium.

9. The method of claim 8, further comprising the steps of:
    (a) applying a first silicon layer to the first layer of the thermally conductive substance; and
    (b) applying a second silicon layer to the second layer of the thermally conductive substance.

10. The method of claim 1, further comprising the steps of:
(a) aligning a group of blocks of aligned functionalized graphene sheets so that the first end face of each block is substantially coplanar with the first end face of each other block;
(b) applying a common first layer of a thermally conductive substance to the first end face of each block; and
(c) applying a second common layer of the thermally conductive substance to the second end face of each block.

11. The method of claim 10, wherein the thermally conductive substance comprises indium.

12. The method of claim 10, further comprising the steps of:
(a) applying a first silicon layer to the first layer of the thermally conductive substance; and
(b) applying a second silicon layer to the second layer of the thermally conductive substance.

13. A method of making a thermal interface material for thermally coupling a heat source to a heat sink, comprising the steps of:
(a) dispersing functionalized graphene sheets in a liquid;
(b) removing the liquid through a filter so as to form a filtration cake of aligned functionalized graphene sheets, substantially all of which are parallel to a common plane;
(c) cutting at least one block of aligned functionalized graphene sheets from the filtration cake, the block including a first end face and an oppositely-disposed second end face that are parallel to each other and to which substantially all of the functionalized graphene sheets are transverse, the block also including two oppositely-disposed sides to which substantially all of the functionalized graphene sheets are parallel;
(d) applying a first stabilizing layer to the first end face and a second stabilizing layer to the second end face; and
(e) placing the first stabilizing layer to be in thermal communication with the heat source and the second stabilizing layer to be in thermal communication with the heat sink.

14. A method of making a thermal interface material, comprising the steps of:
(a) dispersing functionalized graphene sheets in a liquid;
(b) removing the liquid through a filter so as to form a filtration cake of aligned functionalized graphene sheets, substantially all of which are parallel to a common plane, wherein the removing of the liquid is performed through a filtration process that includes the steps of:
  (i) disposing the functionalized graphene sheets dispersed in the liquid on a first side filtration paper; and
  (ii) applying a vacuum to a second side of the filtration paper, wherein the second side is opposite from the first side, so as to draw the liquid through the filtration paper and away from the functionalized graphene sheets;
(c) cutting at least one block of aligned functionalized graphene sheets from the filtration cake, the block including a first end face and an oppositely-disposed second end face that are parallel to each other and to which substantially all of the functionalized graphene sheets are transverse, the block also including two oppositely-disposed sides to which substantially all of the functionalized graphene sheets are parallel;
(d) applying a first layer of a thermally conductive substance to the first end face and applying a second layer of the thermally conductive substance to the second end face of the block;
(e) aligning a group of blocks of aligned functionalized graphene sheets so that the first end face of each block is substantially coplanar with the first end face of each other block;
(f) applying a common first layer of a thermally conductive substance to the first end face of each block;
(g) applying a second common layer of the thermally conductive substance to the second end face of each block;
(h) applying a first silicon layer to the first layer of the thermally conductive substance; and
(i) applying a second silicon layer to the second layer of the thermally conductive substance.

15. The method of claim 14, wherein the filtration paper comprises an aluminum oxide filtration paper.

16. The method of claim 14, wherein the liquid comprises water.

17. The method of claim 14, wherein the functionalized graphene sheets comprise functionalized multilayer graphene sheets.

18. The method of claim 14, wherein the functionalized graphene sheets comprise graphene functionalized with functional groups of a material selected from a group of materials consisting of: conjugated carbon-carbon, carbon-hydroxyls, carboxyls, and combinations thereof.

19. The method of claim 14, wherein the thermally conductive substance comprises indium.

* * * * *